United States Patent
Barlocchi et al.

(10) Patent No.: US 6,376,291 B1
(45) Date of Patent: Apr. 23, 2002

(54) PROCESS FOR MANUFACTURING BURIED CHANNELS AND CAVITIES IN SEMICONDUCTOR MATERIAL WAFERS

(75) Inventors: Gabriele Barlocchi, Cornaredo; Flavio Villa, Milan; Pietro Corona, Rome, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/558,959

(22) Filed: Apr. 25, 2000

(30) Foreign Application Priority Data

Apr. 29, 1999 (EP) .............................. 99830255

(51) Int. Cl.$^7$ .............................. H01L 21/338
(52) U.S. Cl. ....................... 438/175; 438/300
(58) Field of Search ................. 438/175, 179, 438/259, 269, 286, 300, 386, 413, 416, 422, 429

(56) References Cited

U.S. PATENT DOCUMENTS

| | | | |
|---|---|---|---|
| 4,685,198 A | * | 8/1987 | Kawakita et al. ............. 437/73 |
| 4,771,638 A | | 9/1988 | Sugiyama et al. ............. 73/721 |
| 4,993,143 A | | 2/1991 | Sidner et al. ............. 29/621.1 |
| 5,932,396 A | * | 8/1999 | Kamijima ................... 430/320 |

FOREIGN PATENT DOCUMENTS

EP           0 890 998           1/1999

OTHER PUBLICATIONS

Tabata, O. et al., "Anisotropic Etching of Silicon in $(CH_3)_4NOH$ Solutions," *IEEE*, pp. 811–814, 1991.

* cited by examiner

*Primary Examiner*—David Nelms
*Assistant Examiner*—David Vu
(74) *Attorney, Agent, or Firm*—Lisa K. Jorgenson; E. Russell Tarleton; SEED IP Law Group, PLLC

(57) ABSTRACT

A process of forming on a monocrystalline-silicon body an etching-aid region of polycrystalline silicon; forming, on the etching-aid region a nucleus region of polycrystalline silicon surrounded by a protective structure having an opening extending as far as the etching-aid region; TMAH-etching the etching-aid region and the monocrystalline body to form a tub-shaped cavity; removing the top layer of the protective structure; and growing an epitaxial layer on the monocrystalline body and the nucleus region. The epitaxial layer, of monocrystalline type on the monocrystalline body and of polycrystalline type on the nucleus region, closes upwardly the etching opening, and the cavity is thus completely embedded in the resulting wafer.

20 Claims, 4 Drawing Sheets

PROCESS FOR MANUFACTURING BURIED CHANNELS AND CAVITIES IN SEMICONDUCTOR MATERIAL WAFERS

TECHNICAL FIELD

The present invention regards a process for manufacturing buried channels and cavities in semiconductor material wafers.

BACKGROUND OF THE INVENTION

As known, present applications require channels or cavities inside a silicon substrate, for example for making suspended masses of microactuators and/or sensors of various kinds, such as speed, acceleration, and pressure sensors, or for insulating electronic components.

At present, buried cavities can be made basically in two ways. According to a first solution, shown in FIG. 1, two monocrystalline silicon wafers 1, appropriately excavated so as each of them presents a half-cavity, are bonded together using an adhesive layer (for example, silicon oxide 2) so that the two half-cavities form a buried cavity 3.

According to a second solution, shown in FIG. 2, a wafer 1 of monocrystalline silicon, appropriately excavated so as to present final cavities 4, is bonded to a glass layer 5 (anodic bonding process).

Such solutions are costly, highly critical, have low productivity, and are not completely compatible with the usual technological phases involved in the manufacture of microelectronic components. In addition, in the solution of FIG. 2, it is not always possible to make also an integrated circuit.

SUMMARY OF THE INVENTION

The embodiments of the present invention provide a process that eliminates the disadvantages of the known solutions.

According to an embodiment of the present invention, a process for manufacturing buried cavities in semiconductor material wafers and a semiconductor material wafer are provided. The process includes forming a nucleus region in a monocrystalline body surrounded by a protective structure, forming a cavity beneath the nucleus region, removing at least a top portion of the protective structure, and growing an epitaxial layer on the body and over the nucleus region.

BRIEF DESCRIPTION OF THE DRAWINGS

For an understanding of the present invention, a preferred embodiment thereof is now described, as a non-limiting example, with reference to the attached drawings, wherein.

DETAILED DESCRIPTION OF THE INVENTION

Figure 1:
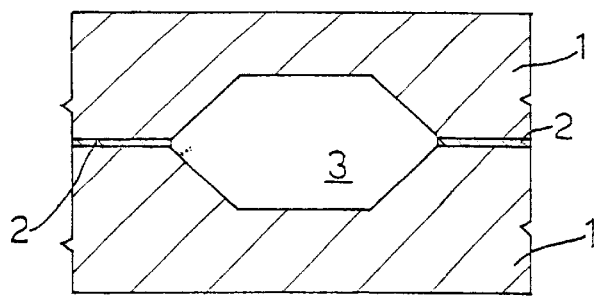
FIG. 1 shows a cross section through a semiconductor material wafer made according to a known solution.
Figure 2:
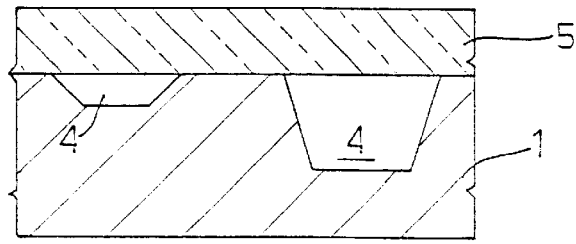
FIG. 2 presents a cross section of another known solution.
Figure 3:
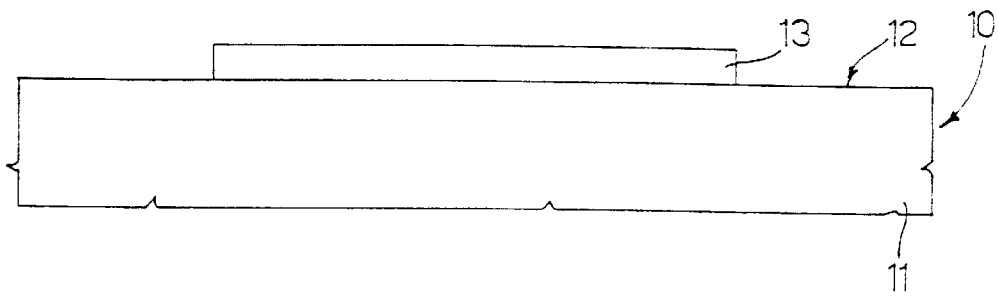
FIGS. 3 to 11 show cross sections through a semiconductor material wafer in successive manufacturing steps according to the present invention.

FIG. 3 shows a wafer 10 of monocrystalline silicon formed by a substrate 11 having a surface 12. On the surface 12 an etching-aid region 13 is formed, and has a thickness preferably comprised between 450 and 1000 nm; the etching-aid region 13 is obtained, for example, by chemical vapor deposition (CVD) of a polycrystalline silicon layer and subsequent definition of the polycrystalline silicon layer, using a resist mask. The etching-aid region 13 has the function of modifying the shape of the desired cavities or channels, as explained hereinafter.

Figure 4:
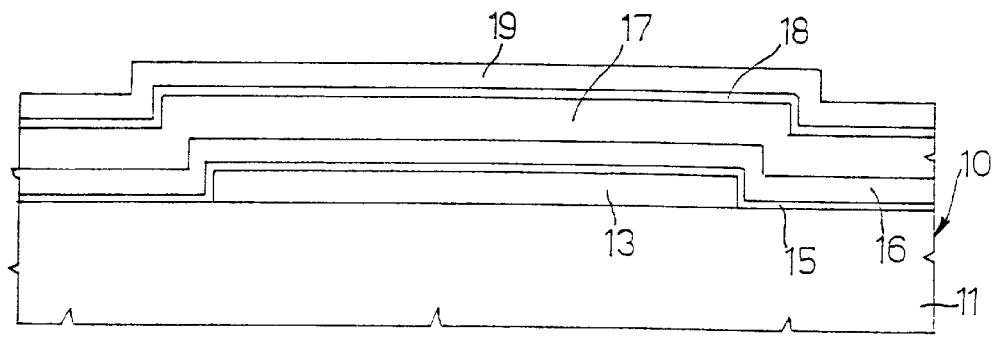

Subsequently, a thermal oxidation is carried out (FIG. 4); a first pad layer 15 of silicon oxide is then grown on the etching-aid region 13 and on the surface 12 of the wafer 10 where the latter is not covered by the etching-aid region 13. The first pad layer 15 has, for example, a thickness comprised between 20 and 100 nm. Thereafter a first etch-shielding layer 16 of silicon nitride having a thickness, for example, comprised between 90 and 200 nm, and then a nucleus layer 17 of polycrystalline silicon having a thickness comprised between 1 and 2 $\mu$m are deposited. The nucleus layer 17 is preferably deposited by CVD. A thermal oxidation is then carried out, forming a second pad layer 18 of silicon oxide, having a thickness comprised, for example, between 20 and 60 nm, on the nucleus layer 17; and then a second etch-shielding layer 19 of silicon nitride is deposited, and has a thickness comprised, for example, between 90 and 200 nm. In this way, the intermediate structure of FIG. 4 is obtained, which presents a stack of layers 16–19.

Figure 5:
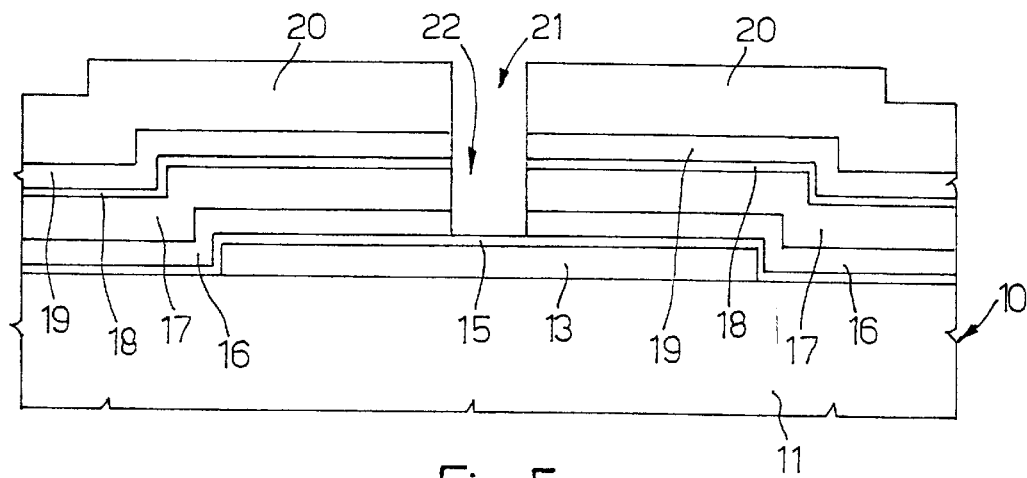

A resist mask 20 is then formed (FIG. 5) and covers the entire wafer 10, except for a window 21 above the etching-aid region 13. Using the resist mask 20, the second etch-shielding layer 19, the second pad layer 18, the nucleus layer 17, and the first etch-shielding layer 16 are etched in succession by dry and wet etchings. Etching ends automatically on the first pad layer 15. At the end of etching, a hole 22 extends through the stack of layers 16–19 down to the first pad layer 15. Advantageously, the width of the hole 22 is comprised between 1 and 5 $\mu$m, and its length and shape (in the direction perpendicular to the plane of the drawing) are determined by the length and shape of the etching-aid region 13 and, ultimately, by the desired characteristics of the cavity to be made.

Figure 6:
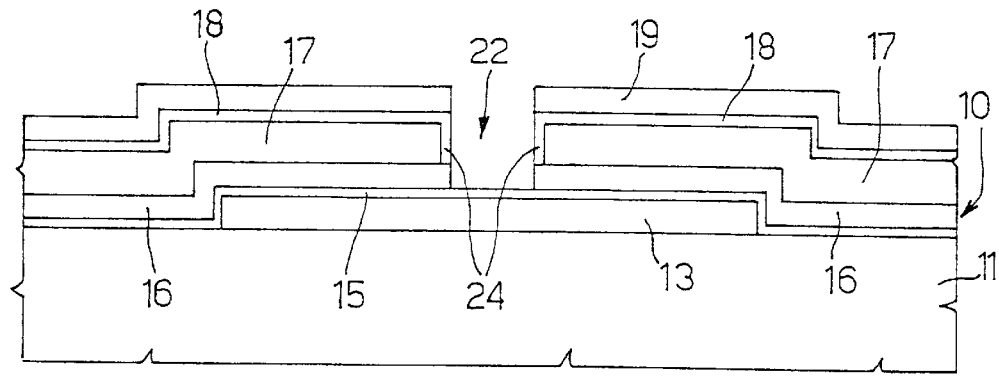

Subsequently (FIG. 6), the resist mask 20 is removed, and the exposed surface of the nucleus layer 17 facing the hole 22 is thermally oxidized and forms an oxide portion 24 having a thickness comprised between, for example, 20 and 100 nm and joining to, without solution of continuity, the second pad layer 18.

Figure 7:
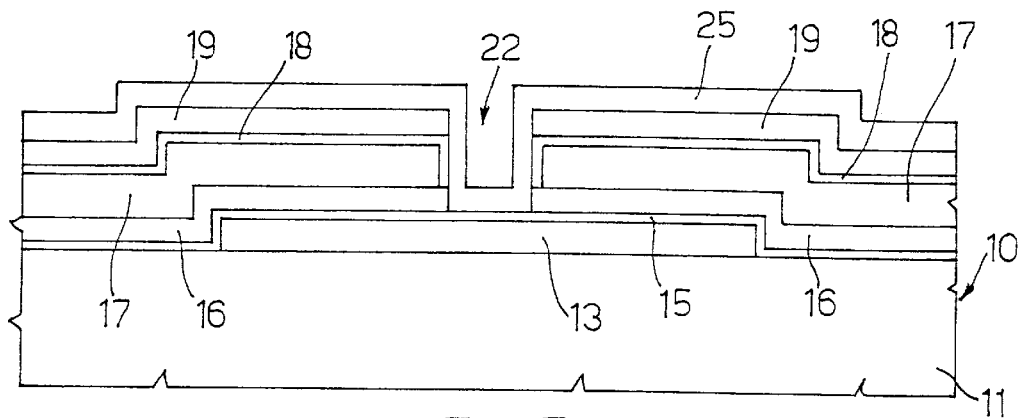
Figure 8:
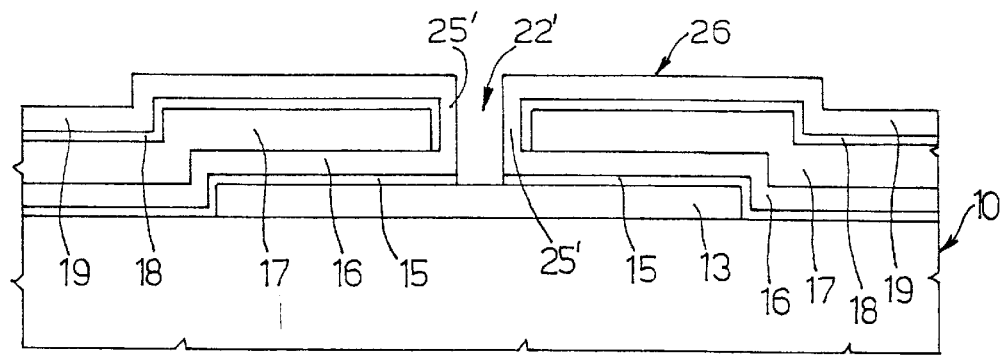

A third etch-shielding layer 25 of silicon nitride is then deposited and has a thickness comprised preferably between 90 and 200 nm (FIG. 7) and completely coats the walls and the bottom of the hole 22. The third etch-shielding layer 25 is then anisotropically etched and is removed in the horizontal portions on the second etch-shielding layer 19 and on the bottom of the hole 22. A coating region 25' remains on the lateral walls of the hole (now indicated with 22') and joins, without solution of continuity, with the first and second etch-shielding layers 16, 19, also of silicon nitride, forming with the latter a protective structure 26, which completely envelops the second nucleus layer 17 (FIG. 8).

Next, the uncovered portion of the first pad layer 15, beneath the hole 22', is dry or wet etched, in a time controlled way, uncovering the etching-aid region 13. The intermediate structure shown in FIG. 8 is thus obtained.

Figure 9:
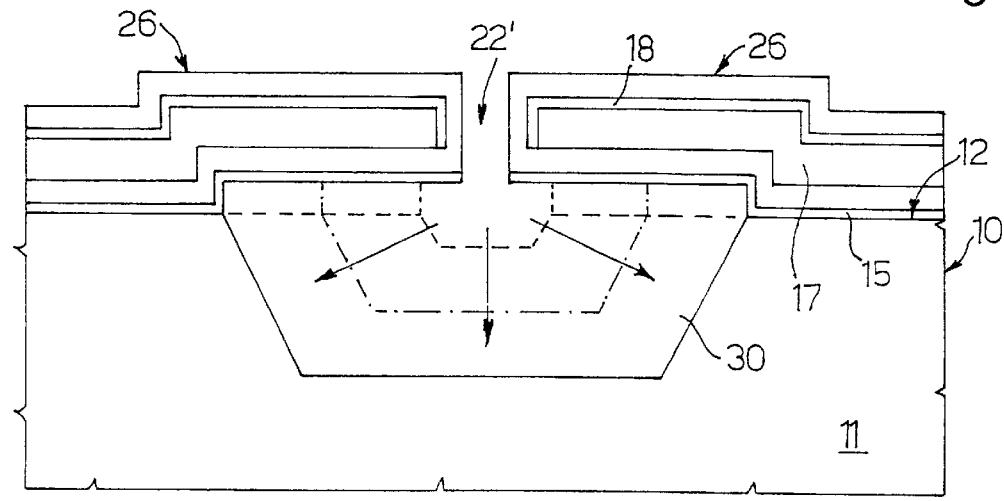

The substrate 11 is then etched, in a time controlled way, using tetramethylammoniumhydroxide (TMAH) having the formula $(CH_3)_4NOH$ (FIG. 9). The shape of the etching is determined by both the presence of the etching-aid region 13 and the etch directionality. In fact, since the etching-aid region 13 is of polycrystalline silicon, it is removed preferentially with respect to the substrate 11, which is of monocrystalline silicon, and determines the etch extent, parallel to the surface 12. On the other hand, with the structure of FIG. 9, where the surface 12 of the wafer has orientation <100>, the oblique etching speed, according to the orientation <111>, is much lower than the etching speed according to the orientation <100> ($V_{<111>} \ll V_{<100>}$), and the monocrystalline silicon of the substrate 11 is preferentially etched along the vertical.

It follows that, on the whole, etching occurs according to fronts having a width determined by the progressive removal of the etching-aid region 13, and extends in depth into the substrate 11, as shown in FIG. 9, where the dashed lines and the dashed and dotted lines indicate successive etching fronts, and the arrows indicate the etching advancement direction. At the end of etching, after a preset time, dependent on the width of the etching-aid region 13, a tub shaped cavity 30 is formed in the substrate 11. In this step, the nucleus layer 17 is protected by the protective structure 26.

Figure 10:
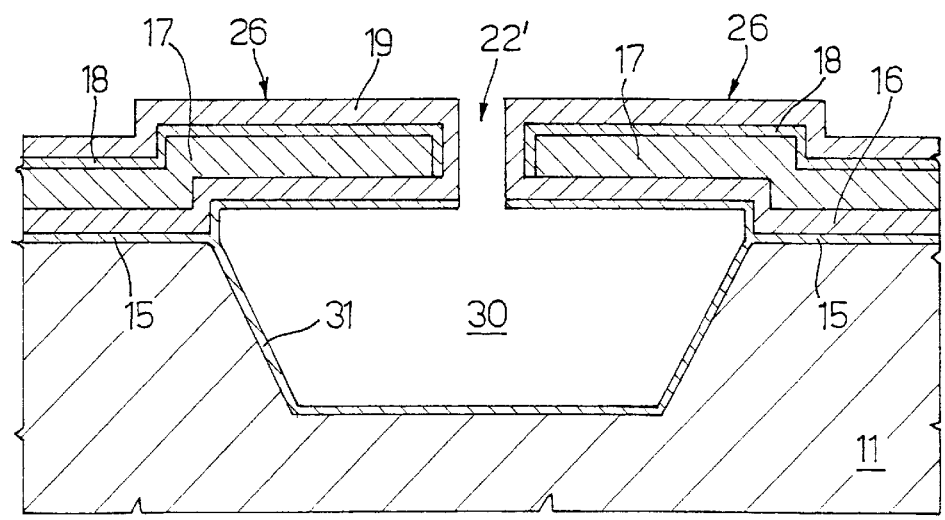

The wall of the cavity 30 is then thermally oxidized and forms a protective layer 31 (FIG. 10) having a thickness preferably comprised between 60 and 300 nm.

Figure 11:
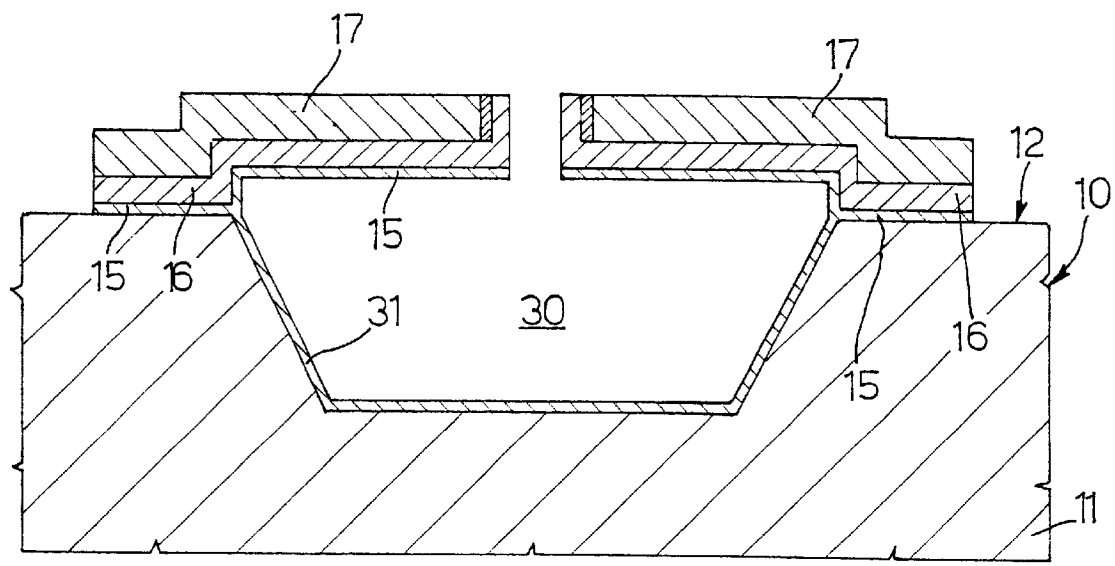

Subsequently (FIG. 11), the nitride material is etched, removing the second etch-shielding layer 19, and then the second oxide pad layer 18 is etched. Given the greater thickness of the protective layer 31, as compared to the second pad layer 19, in this step the protective layer 31 is, at most, removed only partially.

Using a resist mask, the nucleus layer 17 is suitably shaped so as to be removed everywhere, except above and around the cavity 30; in addition, the first etch-shielding layer 16 and the first pad layer 15 are etched and removed where they are exposed. Consequently, the surface 12 of the substrate 11 is once more exposed, except for at the cavity 30.

Figure 12:
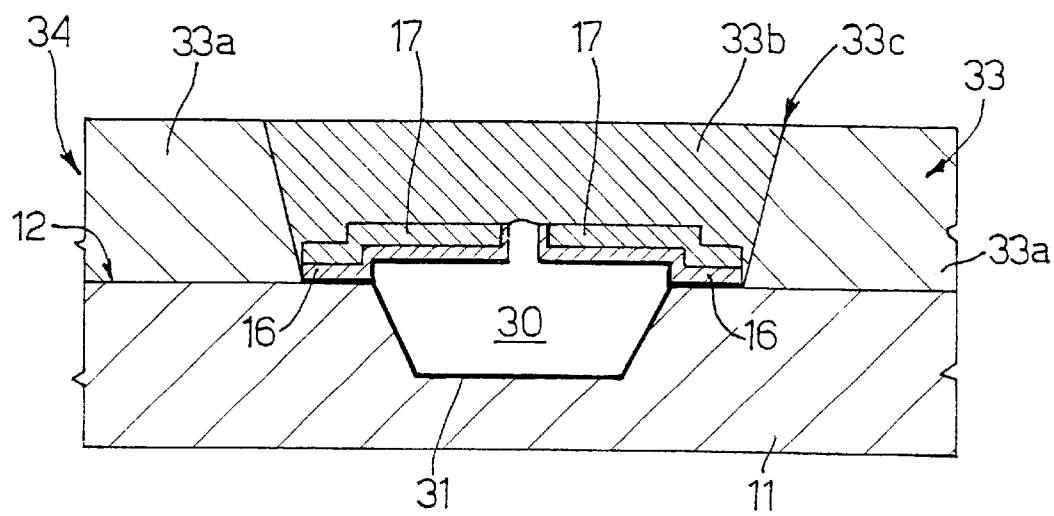
FIG. 12 shows, on a reduced scale, the wafer obtained with the manufacturing process according to the present invention.

Finally (FIG. 12), epitaxial growth is carried out starting from the substrate 11 (where this is not covered) and from the nucleus layer 17. In particular, a so-called pseudo-epitaxial layer 33 is formed by a monocrystalline portion 33a on the substrate 11 and a polycrystalline portion 33b on the nucleus layer 17, these portions being separated by a transitional region 33c, as shown in FIG. 12. The substrate 11 and the pseudo-epitaxial layer 33 thus form a wafer 34. In addition, the epitaxial growth over the nucleus layer 17 takes place also horizontally, closing the hole 22'. Consequently, the cavity 30 is closed on all its sides and is completely embedded in the wafer 34.

The wafer 34 then undergoes further processing steps according to the devices to be made. In particular, in the polycrystalline portion 33b, suspended structures are made, such as membranes, induction coils, accelerometers, etc., and in the monocrystalline portion 33a of the pseudo-epitaxial layer 33 electronic processing and control components are integrated.

The advantages of the described process are the following: first, the process enables forming closed cavities in a silicon wafer with process steps that are fully compatible with semiconductor manufacturing processes. The process does not present particular critical aspects, and enables good productivity, contained costs, and the integration of microstructures and electronic components.

Finally, it is clear that modifications and variations can be made to the process described and illustrated herein, all of which fall within the scope of the invention, as defined in the attached claims. In particular, the size, shape and number of holes 22' are suitably chosen on the basis of the size and shape of the cavity 30 to be formed and of the characteristics of the TMAH etching on the substrate 11. In particular, in the case of a hole 22' of an elongated shape, it is possible to obtain elongated channels; in the case of suspended structures of large area, it is possible to make a number of holes 22' above a same etching-aid region 13 so as to form a number of initial cavities which then join up to form a final, large size cavity parallel to the surface 12 of the substrate 11.

In addition, the thermal oxidation used to form the protective layer 31 may be omitted, and the nucleus layer 17 can be made in two steps by depositing a thin vapor-phase layer and then growing a polycrystalline layer epitaxially up to the desired thickness.

Finally, after forming the cavity 30, the removal of the second etch-shielding layer 19 and of the second pad layer 18 can be carried by wet etching, also removing the coating region 25' and the oxide portion 24.

While a preferred embodiment of the invention has been illustrated and described, it is to be understood that various changes can be made therein without departing from the spirit and scope thereof. Thus, the invention is to be limited only by the scope of the claims that follow and the equivalents thereof.

What is claimed is:

1. A process for manufacturing unfilled buried cavities in semiconductor material wafers, comprising:

forming, on a monocrystalline body of semiconductor material, a nucleus region surrounded by a protective structure;

forming a cavity in said monocrystalline body beneath said nucleus region;

removing at least a top portion of said protective structure; and growing an epitaxial layer over the cavity on said monocrystalline body and said nucleus region.

2. The process of claim 1 wherein forming a cavity comprises etching said monocrystalline body through an opening delimited by said protective structure.

3. The process of claim 1 wherein said etching step is carried out by TMAH-etching.

4. The process of claim 1, further comprising, before forming a nucleus region, the forming of an etching-aid region directly on said monocrystalline body, said etching-aid region being arranged beneath said nucleus region and being separated from said nucleus region by said protective structure.

5. The process of claim 4 wherein said etching-aid region is of polycrystalline silicon.

6. The process of claim 4 wherein forming a nucleus region comprises:

forming, on said monocrystalline body and said etching-aid region, a layer stack comprising a first etch-shielding layer, a polycrystalline-silicon layer, and a second etch-shielding layer;

forming, in said layer stack and on said etching-aid region, a window having side delimiting walls; and coating said side delimiting walls of said window with a coating region, forming an opening for etching said monocrystalline body.

7. The process of claim 6 wherein said first and second etch-shielding layers and said coating region are of silicon nitride.

8. The process of claim 7, further comprising forming a thermal oxide layer beneath said first and second etch-shielding layers and forming thermal oxide regions beneath said coating region.

9. The process of claim 1, further comprising forming a protective region on walls of said cavity before removing a top portion of said protective structure.

10. The process of claim 9 wherein forming a protective region comprises thermally oxidizing said walls of said cavity.

11. The process of claim 1 wherein growing an epitaxial layer comprises forming a monocrystalline region on said monocrystalline body, and a polycrystalline region on said nucleus region.

12. A process for manufacturing unfilled buried cavities in semiconductor material, comprising:

forming a protective structure on a substrate of semiconductor material, the protective structure having an opening formed therein;

forming a cavity in the substrate below the protective structure and in communication with the opening; and forming an epitaxial layer over the protective structure to cover the opening.

13. The process of claim 12 wherein forming a protective structure comprises forming on the substrate an etching-aid region and a layer stack.

14. The process of claim 13 wherein the etching-aid region comprises a polycrystalline silicone layer, and wherein the layer stack comprises a first etch-shielding layer, a polycrystalline-silicone layer on the first etch-shielding layer, and a second etch-shielding layer on the polycrystalline-silicone layer.

15. The process of claim 14 wherein forming the protective region further comprises forming a coating on the layer stack and on walls of the opening.

16. The process of claim 12 wherein forming the cavity in the substrate comprises etching the substrate through the opening by TMAH-etching.

17. A process for manufacturing buried cavities and semiconductor wafers, comprising:

forming an etching-aid region directly on a monocrystalline body of semiconductor material, the etching-aid region being formed of polycrystalline silicon;

forming a nucleus region surrounded by a protective structure that covers the etching-aid region;

forming a cavity in the monocrystalline body beneath the nucleus region;

removing at least a top portion of the protective structure; and growing an epitaxial layer on the monocrystalline body and the nucleus region.

18. A process for manufacturing buried cavities in semiconductor material wafers, comprising:

forming, on a monocrystalline body of semiconductor material, a nucleus region surrounded by a protective structure;

forming a cavity in said monocrystalline body beneath said nucleus region;

removing at least a top portion of said protective structure; and growing an epitaxial layer on said monocrystalline body and said nucleus region, comprising forming a monocrystalline region on the monocrystalline body and a polycrystalline region on the nucleus region.

19. A process for manufacturing buried cavities in semiconductor material, comprising:

forming a protective structure on a substrate of semiconductor material, the protective structure having an opening formed therein, comprising forming on the substrate an etching-aid region and a layer stack, the etching-aid region comprising a polycrystalline silicon layer, and the layer stack comprising a first etch-shielding layer, a polycrystalline-silicon layer on the first etch-shielding layer, and a second etch-shielding layer on the polycrystalline-silicon layer;

forming a cavity in the substrate below the protective structure and in communication with the opening; and forming an epitaxial layer over the protective structure to cover the opening.

20. A process for manufacturing buried cavities in semiconductor material, comprising:

forming a protective structure on a substrate of semiconductor material, the protective structure having an opening formed therein, forming the protective structure for the comprising forming on the substrate an etching-aid region and a layer stack, the etching-aid region comprising a polycrystalline silicon layer, and the layer stack comprising a first etch-shielding layer, a polycrystalline-silicon layer on the first etch-shielding layer, and a second etch-shielding layer on the polycrystalline-silicon layer, and further forming a coating on the layer stack and on walls of the opening;

forming a cavity in the substrate below the protective structure and in communication with the opening; and forming an epitaxial layer over the protective structure to cover the opening.

* * * * *